United States Patent
Park et al.

(10) Patent No.: US 9,307,675 B2
(45) Date of Patent: Apr. 5, 2016

(54) RADIANT HEAT CIRCUIT BOARD, METHOD OF MANUFACTURING THE SAME, HEAT GENERATING DEVICE PACKAGE HAVING THE SAME, AND BACKLIGHT

(75) Inventors: Hyun Gyu Park, Seoul (KR); Eun Jin Kim, Seoul (KR); Hae Yeon Kim, Seoul (KR); Jae Man Park, Seoul (KR); Yun Ho An, Seoul (KR); Hyuk Soo Lee, Seoul (KR); In Hee Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 224 days.

(21) Appl. No.: 13/878,637

(22) PCT Filed: Oct. 10, 2011

(86) PCT No.: PCT/KR2011/007494
§ 371 (c)(1),
(2), (4) Date: Apr. 10, 2013

(87) PCT Pub. No.: WO2012/050333
PCT Pub. Date: Apr. 19, 2012

(65) Prior Publication Data
US 2013/0188359 A1    Jul. 25, 2013

(30) Foreign Application Priority Data
Oct. 11, 2010  (KR) .................. 10-2010-0099002

(51) Int. Cl.
*F21V 29/00*    (2015.01)
*H05K 7/20*    (2006.01)
(Continued)

(52) U.S. Cl.
CPC ............... *H05K 7/205* (2013.01); *F21V 29/70* (2015.01); *G02F 1/133615* (2013.01);
(Continued)

(58) Field of Classification Search
CPC .................. F21Y 2101/02; F21Y 2101/2103; F21Y 2101/003; F21K 9/00; F21V 23/005; H01L 33/62; H01L 25/0753; H05K 7/205
USPC ............................................ 362/249.02, 294
See application file for complete search history.

(56) References Cited

U.S. PATENT DOCUMENTS 7,380,961 B2 * 6/2008 Moriyama et al. ............ 362/238
7,495,322 B2 * 2/2009 Hashimoto et al. ........... 257/676
(Continued)

FOREIGN PATENT DOCUMENTS

JP      2002-094122 A    3/2002
KR  10-2010-0049841 A    5/2010
(Continued)

OTHER PUBLICATIONS

International Search Report in International Application No. PCT/KR2011/007494, filed Oct. 10, 2011.
(Continued)

*Primary Examiner* — Peggy Neils
(74) *Attorney, Agent, or Firm* — Saliwanchik, Lloyd & Eisenschenk (57) ABSTRACT

Provided is a radiant heat circuit board for mounting a plurality of heat generating devices. The radiant heat circuit board includes a metal plate comprising an integrated metal projection to which the plurality of heat generating devices are attached, an insulation member exposing the integrated metal projection, the insulation member comprising a plurality of insulation layers disposed on the metal plate, and first and second electrode pads disposed on the insulation member, the first and second electrode pads disposed being electrically separated from each other. The first and second electrode pads receives a voltage from circuit wires disposed on the insulation layers different from each other of the insulation member. Thus, a radiant projection may be disposed between the heat generating devices to improve heat radiation.

17 Claims, 4 Drawing Sheets

(51) Int. Cl.

| | |
|---|---|
| *H01L 23/367* | (2006.01) |
| *H01L 25/075* | (2006.01) |
| *H01L 33/64* | (2010.01) |
| *H05K 3/30* | (2006.01) |
| *H05K 13/00* | (2006.01) |
| *G02F 1/1335* | (2006.01) |
| *H05K 1/02* | (2006.01) |
| *H05K 3/46* | (2006.01) |
| *F21V 29/70* | (2015.01) |
| *H05K 1/05* | (2006.01) |
| *H05K 1/11* | (2006.01) |

(52) U.S. Cl.
CPC ....... *H01L 23/3677* (2013.01); *H01L 25/0753* (2013.01); *H01L 33/647* (2013.01); *H05K 1/0204* (2013.01); *H05K 3/30* (2013.01); *H05K 3/4608* (2013.01); *H05K 13/00* (2013.01); H01L 2224/16225 (2013.01); *H05K 1/056* (2013.01); *H05K 1/113* (2013.01); *H05K 2201/09054* (2013.01); *H05K 2201/10106* (2013.01); *H05K 2201/10969* (2013.01); *Y10T 29/4913* (2015.01)

(56) References Cited

U.S. PATENT DOCUMENTS

| | | | | |
|---|---|---|---|---|
| 7,690,817 | B2* | 4/2010 | Sanpei et al. | 362/294 |
| 8,070,316 | B2* | 12/2011 | Urano et al. | 362/249.02 |
| 8,203,165 | B2* | 6/2012 | Lee et al. | 257/99 |
| 8,465,176 | B2* | 6/2013 | Jang | 362/249.06 |
| 2004/0065894 | A1 | 4/2004 | Hashimoto et al. | |
| 2007/0211205 | A1 | 9/2007 | Shibata | |
| 2008/0278917 | A1 | 11/2008 | Lin et al. | |
| 2009/0002988 | A1 | 1/2009 | Kim et al. | |
| 2009/0066877 | A1 | 3/2009 | Abe et al. | |
| 2009/0219719 | A1* | 9/2009 | Hsu et al. | 362/249.02 |
| 2010/0055811 | A1* | 3/2010 | Lin et al. | 438/26 |
| 2010/0103680 | A1* | 4/2010 | Oyaizu et al. | 362/294 |
| 2010/0264798 | A1* | 10/2010 | Ruan | 313/46 |

FOREIGN PATENT DOCUMENTS

| | | |
|---|---|---|
| TW | M311844 U | 5/2007 |
| TW | M344004 U | 11/2008 |

OTHER PUBLICATIONS

Office Action dated Jan. 4, 2012 in Korean Application No. 10-2010-0099002, filed Oct. 11, 2010.

European Search Report dated Mar. 12, 2014 in European Application No. 11832720.4.

Office Action dated Jul. 22, 2013 in Taiwanese Application No. 100135525, filed Sep. 30, 2011.

\* cited by examiner

Fig. 1

Prior Art

RADIANT HEAT CIRCUIT BOARD, METHOD OF MANUFACTURING THE SAME, HEAT GENERATING DEVICE PACKAGE HAVING THE SAME, AND BACKLIGHT

CROSS-REFERENCE TO RELATED APPLICATIONS

This application is the U.S. national stage application of International Patent Application No. PCT/KR2011/007494, filed Oct. 10, 2011, which claims priority to Korean Application No. 10-2010-0099002, filed Oct. 11, 2010, the disclosures of each of which are incorporated herein by reference in their entirety.

TECHNICAL FIELD

The present disclosure relates to a radiant heat circuit board.

BACKGROUND ART

A circuit board includes a circuit pattern on an insulation board. The circuit board is a board for mounting electric components.

Such an electric component may include a heat generating device, e.g., a light emitting diode (LED). The heat generating device may emit serious heat. Heat emitted from the heat generating device may increase a temperature of the circuit board to cause malfunction of the heat generating device and deteriorate reliability of the heat generating device.

Figure 1:
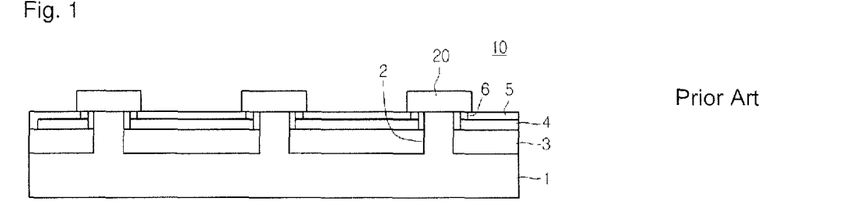
FIG. 1 is a sectional view of a radiant heat circuit board according to a related art.

To solve the limitation due to the radiant heat, a radiant heat circuit board of FIG. 1 has been proposed.

FIG. 1 is a sectional view of a radiant heat circuit board according to a related art.

Referring to FIG. 1, a radiant heat circuit board according to a related art includes a metal plate 1 including a radiant heat projection 2, an insulation layer 3, a circuit pattern 4, and a solder resist 5.

In the radiant heat circuit board 10, a heat generating device 20 is attached to the radiant heat projection 2 to transfer heat into the lower metal plate 1. Here, the heat generating device is connected to the circuit pattern 4 through a solder 6.

In the radiant heat circuit board 10 according to the related art, heat emitted from the mounted heat generating device 20 is not transferred into the metal plate 2 for releasing heat due to interference of the insulation layer 3.

DISCLOSURE OF INVENTION

Technical Problem

Embodiments provide a radiant heat circuit board having a new structure and a heat generating device package having the same.

Embodiments also provide a radiant heat circuit board having improved efficiency and a heat generating device package having the same.

Solution to Problem

In one embodiment, a radiant heat circuit board for mounting a plurality of heat generating devices includes: a metal plate including an integrated metal projection to which the plurality of heat generating devices are attached; an insulation member exposing the integrated metal projection, the insulation member including a plurality of insulation layers disposed on the metal plate; and first and second electrode pads disposed on the insulation member, the first and second electrode pads disposed being electrically separated from each other. The first or second electrode pads may receive a voltage from circuit wires disposed on the insulation layers different from each other of the insulation member.

In another embodiment, a heat generating device package includes: a radiant heat circuit board including an integrated pad in which a plurality device mounting areas are defined, the integrated pad crossing the plurality of device mounting areas and being connected to each other, a plurality of insulation layers exposing the integrated pad and burying a plurality of circuit patterns, and a plurality of electrode pads disposed on the insulation layers and connected to the circuit patterns; and a plurality of heat generating devices attached to the integrated pad and the electrode pads which are exposed to each of the device mounting areas.

In further another embodiment, a method of manufacturing a radiant heat circuit board for mounting a plurality of heat generating devices includes: forming an integrated metal projection for attaching the plurality of heat generating devices on a metal plate at the same time; forming an insulation layer exposing the metal projection on the metal plate and including a buried circuit pattern; forming a via hole exposing the buried circuit pattern in the insulation layer; and forming an electrode pad connected to the buried circuit pattern by the via hole on the insulation layer.

The details of one or more embodiments are set forth in the accompanying drawings and the description below. Other features will be apparent from the description and drawings, and from the claims.

Advantageous Effects of Invention

According to the embodiments, the metal plate including the radiant heat projection may be disposed under the mounting pad to directly transfer heat emitted from the heat generating devices into the metal plate, thereby improving the thermal efficiency. Also, the radiant heat projection may be integrated to perform heat transfer between the heat generating devices, thereby improving the heat radiation. Also, the electrode pad may be disposed at a side of the metal projection and the circuit wires for applying a power into the electrode pads are stacked as a plurality of layers to secure the widened area of the metal projection on the top surface of the radiant heat circuit board.

MODE FOR THE INVENTION

Hereinafter, preferred embodiments of the present invention will be described in detail with reference to the accompanying drawings in such a manner that the technical idea of the present invention may easily be carried out by a person with ordinary skill in the art to which the invention pertains. The present disclosure may, however, be embodied in different forms and should not be construed as limited to the embodiments set forth herein.

In this specification, when it is described that one comprises (or includes or has) some elements, it should be understood that it may comprise (or include or has) only those elements, or it may comprise (or include or have) other elements as well as those elements if there is no specific limitation.

In the drawings, anything unnecessary for describing the present disclosure will be omitted for clarity, and thicknesses are enlarged for the purpose of clearly illustrating layers and areas. Like reference numerals in the drawings denote like elements, and thus their descriptions will be omitted.

In the specification, it will be understood that when a layer, a film, a region, or a plate is referred to as being 'on' another layer, film, region, or plate, it can be directly on the other layer, region, or plate, or intervening layers, films, regions, or plates may also be present. On the other hand, it will also be understood that when a layer, a film, an area or a plate is referred to as being "directly on" another one, intervening layers, films, areas, and plates may not be present.

The present disclosure provides a circuit board in which a pad projection for mounting a plurality of heat generating devices on a metal plate are integrated to improve heat radiation.

Hereinafter, a radiant heat circuit board according to an embodiment and a heat generating device package having the same will be described with reference to FIGS. 2 to 6.

Figure 2:
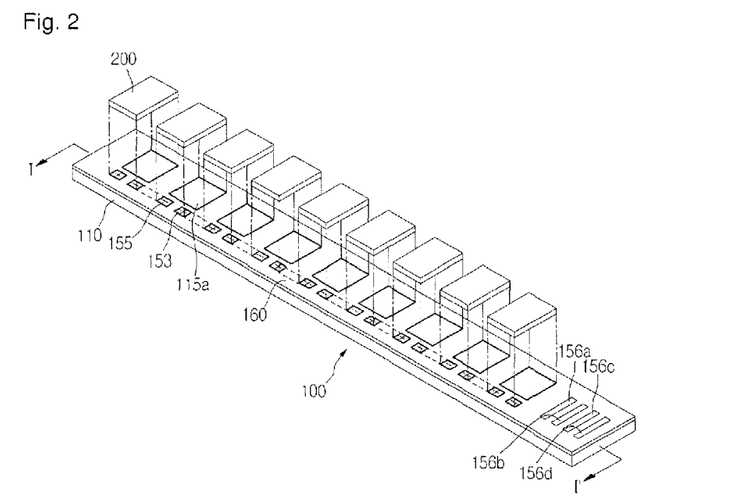
FIG. 2 is an exploded perspective view of a heat generating device package according to an embodiment.
Figure 3:
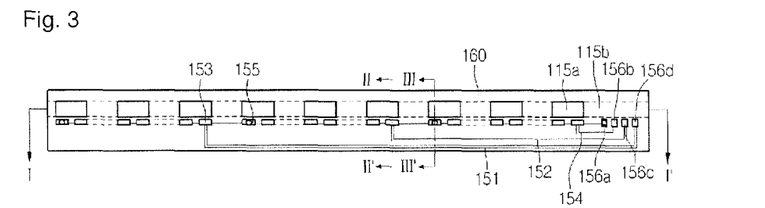
FIG. 3 is a top view illustrating a radiant heat circuit board of FIG. 2.
Figure 4:
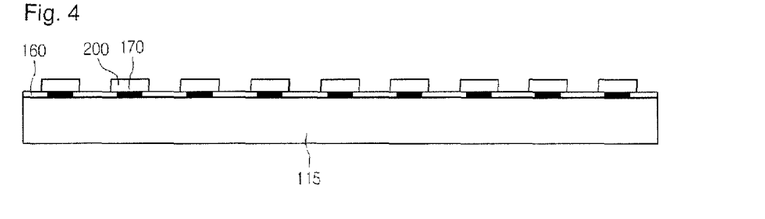
FIG. 4 is a sectional view taken along line I-I' of the heat generating device package of FIG. 3.
Figure 5:
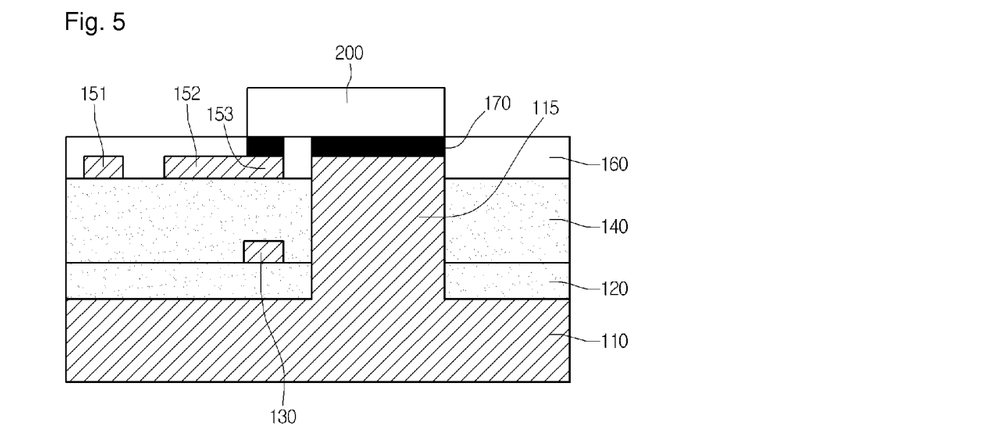
FIG. 5 is a sectional view taken along line II-III' of the heat generating device package of FIG. 3.
Figure 6:
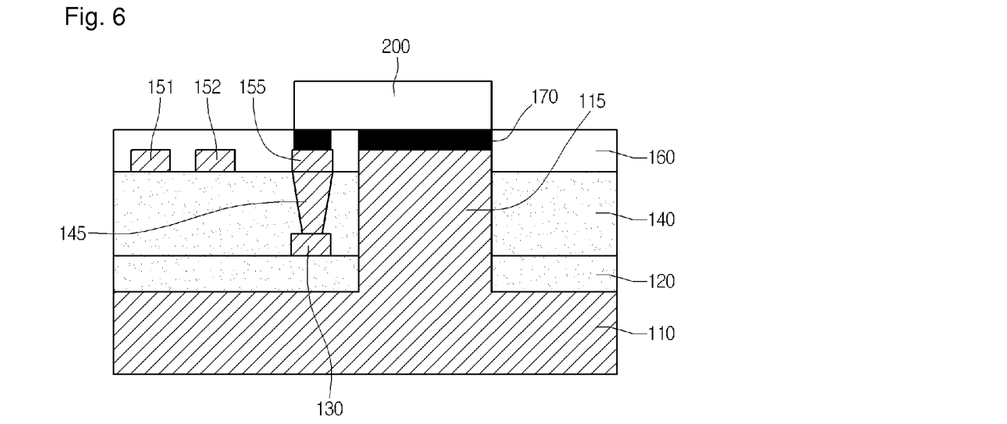
FIG. 6 is a sectional view taken along line III-III' of the heat generating device package of FIG. 3.

FIG. 2 is an exploded perspective view of a heat generating device package according to an embodiment. FIG. 3 is a top view illustrating a radiant heat circuit board of FIG. 2. FIG. 4 is a sectional view taken along line I-I' of the heat generating device package of FIG. 3. FIG. 5 is a sectional view taken along line II-II' of the heat generating device package of FIG. 3. FIG. 6 is a sectional view taken along line III-III' of the heat generating device package of FIG. 3.

Hereinafter, a heat generating device package will be described together with a radiant heat circuit board having the same.

Referring to FIGS. 2 to 6, a heat generating device package according to an embodiment includes a radiant heat circuit board 100 and a plurality of heat generating devices 200 mounted on the radiant heat circuit board 100.

The radiant heat circuit board 100 includes mounting pads 115a arrayed in a line to mount the plurality of heat generating devices 200 arrayed in a line.

Although the bar-type radiant heat circuit board 100 is illustrated in the embodiment, the present disclosure is not limited thereto. For example, the radiant heat circuit board 100 may be provided in a circular or matrix type.

When the plurality of heat generating devices 200 arrayed in a line are mounted on the radiant heat circuit board 100, the radiant heat circuit board 100 may include the plurality of mounting pads 115a arrayed in a line.

The radiant heat circuit board 100 includes a metal plate 100, insulation layers 120, 140, and 160 disposed on the metal plate 110, and circuit patterns 130, 153, 155, 151, 152, 154, 156a, 156b, 156c, and 156d disposed on the insulation layers 120 and 140.

The metal plate 110 may be formed of one of one of alloys containing copper, aluminum, nickel, gold, or platinum which has superior thermal conductivity.

The metal plate 110 includes a metal projection 115 constituting the mounting pad 115a for mounting the heat generating device 200.

The metal projection 115 extends from the metal plate 110 to vertically protrude. A portion of a top surface of the metal projection 115 may serve as the mounting pad 115a for mounting the heat generating device 200. Also, the metal projection 115 has a predetermined width so that a solder 170 is disposed on the top surface thereof.

The metal projection 115 may be integrally provided to simultaneously mount the plurality of heat generating devices 200 arrayed in one line.

That is, the metal projection 115 disposed under the heat generating device 200 and the metal projection 115 disposed under the adjacent heat generating device 200 are connected to each other. Thus, the metal projection 115 extends between the heat generating device 200 and the adjacent heat generating device 200.

The metal plate 110 may be etched or a plating or printing process may be performed on the metal plate 110 to manufacture the integrated metal projection 115.

As described above, since the metal projection 115 is integrally provided under the plurality of heat generating devices 200 arrayed in one line, the metal layer is disposed into an area between the light emitting devices 200 which is filled with insulation layers 120 and 140 in a related art, thereby improving heat radiation.

The integrated metal projection 115 may be opened to form a first insulation layer 120.

The first insulation layer 120 may include a plurality of insulation layers. Also, the first insulation layer 120 insulates the metal plate 110 from the first circuit pattern 130 disposed thereon.

The first insulation layer 120 may be formed of an epoxy-based insulation resin. Also, the first insulation layer 120 may serve as an adhesion layer for attaching the metal plate 110 to an upper copper film layer that is a mother material of the first circuit pattern 130.

The first circuit pattern 130 is disposed on the first insulation layer 120. The first circuit pattern 130 is electrically connected to a first power pad 156a to serve as a signal line for transmitting a positive voltage into the plurality of first electrode pads 155.

The first circuit pattern 130 is disposed on a side of the integrated metal projection 115 to extend along the metal projection 115.

The first circuit pattern 130 is buried to form a second insulation layer 140 on the first insulation layer 120.

The second insulation layer 120 is formed of an epoxy-based insulation resin having low conductivity (about 0.2 W/mk to about 0.4 W/mk). On the other hand, the second insulation layer 140 may be formed of a polyimide-based resin having relatively high conductivity.

A prepreg formed by impregnating the resin into a solid component 21 such as a reinforced fiber, a glass fiber, or a filler may be cured to form the second insulation layer 140.

The second insulation layer 140 may expose the metal projection 115. Also, the second insulation layer 140 may have a thickness less than a height of the metal projection 115.

A plurality of second circuit patterns 153, 155, 151, 152, 154, 156a, 156b, 156c, and 156d are disposed on the second insulation layer 140.

The second circuit patterns 153, 155, 151, 152, 154, 156a, 156b, 156c, and 156d include a plurality of power pads 156a, 156b, 156c, and 156d, a plurality of electrode pads 153 and 155, and a plurality of circuit wires 151, 152, and 154 connecting the power pads 156a, 156b, 156c, and 156d to the electrode pads 153 and 155.

The power pads 156a, 156b, 156c, and 156d are disposed on an edge area of the circuit board 100. The power pads 156a, 156b, 156c, and 156d receive a voltage from the outside to provide the voltage into the electrode pads 153 and 155 through the circuit wires 151, 152, and 154.

The power pads 156a, 156b, 156c, and 156d are exposed by a third insulation layer 160 burying the circuit wire 151, 152, and 154. The power pads 156a, 156b, 156c, and 156d include a first power pad 156a for receiving a positive voltage from the outside and second to third power pads 156b, 156c, and 156d for receiving a negative voltage.

Although three pads 156b, 156c, and 156d for receiving the negative voltage are provided in the current embodiment, the present invention is not limited thereto. For example, the number of power pads may be variously changed according to the number of heat generating devices 200 and a circuit design.

The radiant heat circuit board 100 may be divided into a plurality of division areas (first to third areas). The number of division areas may be equal to that of the power pads 156b, 156c, and 156d for receiving the negative voltage.

Each of the division areas may include a plurality of heat generating device mounting areas. As shown in FIG. 3, three mounting areas may be disposed on one division area.

A mounting pad 115a, a first electrode pad 155 disposed on a side of the mounting pad 115a, and a second electrode pad 153 separated from the first electrode pad 155 by the third insulation layer 160 are disposed on each of the mounting areas.

The electrode pads 153 and 155 may serve as pads for providing voltages different from each other into the heat generating device 200 mounted on each of the heat generating device mounting areas.

The first and second electrode pads 153 and 155 provide voltages having polarities different from each other within one heat generating device mounting area. Thus, the first and second electrode pads 153 and 155 within the one heat generating device mounting area may have a voltage having a polarity different from that of the first and second electrode pads 153 and 155 within the adjacent heat generating device mounting area.

The second electrode pad 153 of the one heat generating device mounting area may be connected to the first electrode pad 155 of the adjacent heat generating device mounting area under the third insulation layer. Here, the same voltage may be applied into the electrode pads 153 and 155 different from and connected to each other.

Specifically, the first one of the first electrode pads 155 in each of the division areas is connected to the first circuit pattern through a via 145 passing through the second insulation layer 140 to receive a positive voltage from the first power pad 156a at the same time.

The last one of the second electrode pads 153 in each of the division areas is connected to the second to fourth power pads 156b, 156c, and 156d through the negative circuit wires 151, 152, and 154 to receive a negative voltage.

Thus, in the first and second electrode pads 153 and 155 within the one division area, a voltage alternately applied into the heat generating device mounting areas has alternately changed polarities. However, the plurality of division areas may have the same voltage distribution.

Here, the first and second electrode pads 153 and 155 are aligned on a layer different from that of the first circuit pattern 130. The negative circuit wires 151, 152, and 154 may be disposed on a side of the mounting pad 115a in the same direction as those of the first and second electrode pads 153 and 155. Thus, the metal projection 115 which is capable of forming the mounting pad 115a of the heat generating device 200 may be widened in area.

The third insulation layer 160 exposes the power pads 156a, 156b, 156c, and 156d and buries the circuit wires 151, 152, and 154. Also, in each of the heat generating device mounting areas, the third insulation layer 160 exposes the mounting pad 115a that is a top surface of the metal projection 115 and the first and second electrode pads 153 and 155.

Here, in each of the exposed pads 115a, 153, 155, 156a, 156b, 156c, and 156d, a metal for forming the circuit patterns may be surface-treated. For the surface treatment, a plating process may be performed using silver, nickel, or gold to easily realize wire bonding or solder bonding.

The third insulation layer 160 may be formed of a solder resist to protect the lower circuit pattern.

A solder 170 may be disposed on the first and second electrode pads 153 and 155 and the mounting pad 115a which are exposed by the third insulation layer 160 to attach the heat generating device 200 to the radiant heat circuit board 100.

A lead solder or lead-free solder cream may be coated on the metal projection 115 and then the heat generating device 200 may be mounted to thermally treat the resultant, thereby forming the solder 170.

The heat generating device 200 may be a light emitting device such as a light emitting diode (LED). Each of the electrodes of the heat generating device 200 may be connected to the first and second electrode pads 153 and 155 to emit light.

As described above, in the radiant heat circuit board 100 for mounting the plurality of heat generating devices 200, the pad 115a for mounting the heat generating device 200 is manufactured using a top surface of the metal projection 115 connected to the metal plate 110, and also the metal projection 115 is integrally formed with respect to the plurality of heat generating devices 200. Thus, the heat radiation may be performed through the metal projection 115 between the heat generating devices 200 to improve the heat radiation. Also, the electrode pads 153 and 155 may be disposed on a side of the metal projection 115 and the circuit wire supplying the positive voltage may be disposed on the lower insulation layer to expand an area occupied by the metal projection on the top surface of the circuit board.

Hereinafter, a method of manufacturing a heat generating device package of FIG. 2 will be described with reference to FIGS. 7 to 14.

FIGS. 7 to 14 are views illustrating a process of manufacturing the heat generating device package of FIG. 2.

Figure 7:
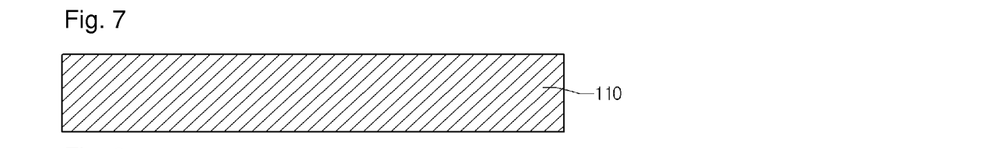
FIGS. 7 to 14 are views illustrating a process of manufacturing the heat generating device package of FIG. 2.
Figure 8:
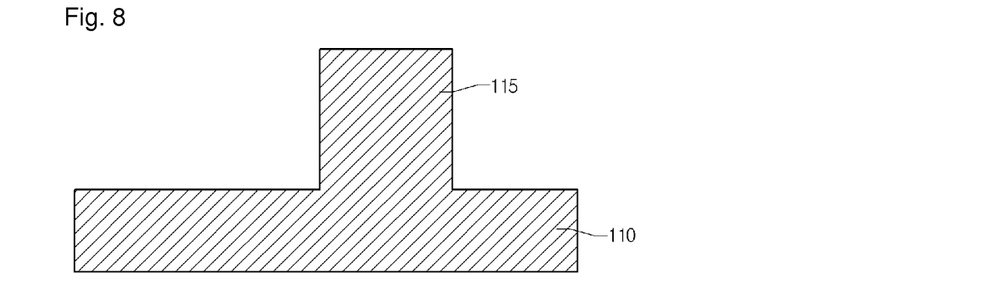

First, as shown in FIG. 7, a metal plate 110 is prepared. Then, as shown in FIG. 8, the metal projection 115 is formed on the metal plate 110.

Here, the metal plate 110 may be formed of one of one of alloys containing copper, aluminum, nickel, gold, or platinum which has superior thermal conductivity.

The metal plate 110 may be molded in a predetermined shape using a rolling process or etched to form the metal projection 115.

Alternatively, a plating or printing process may be performed on the metal plate 110 to form the metal projection 115.

Here, the metal projection 115 may have a height greater than a thickness of each of insulation layers 120 and 140 that will be formed later in consideration of the thickness of each of the insulation layers 120 and 140.

The metal projection 115 may be disposed at a center of the metal plate 110 of the radiant heat circuit board 100. Preferably, the metal projection 115 may be disposed on positions spaced from both edges of the metal plate 110 by distances different from each other.

Figure 9:
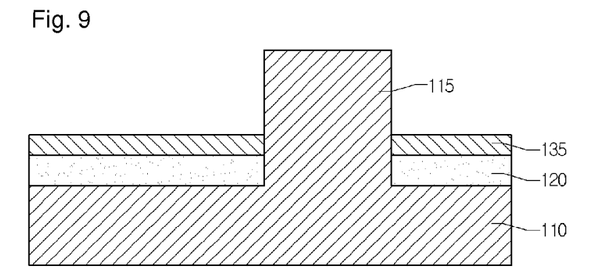

As shown in FIG. 9, a first insulation layer 120 and a copper film layer 135 are formed on the metal plate 10.

The first insulation layer 120 may be formed by coating a prepreg in which a resin such as an epoxy-based resin into a reinforced fiber, a glass fiber, or a filler on the metal plate 110. Also, the first insulation layer 120 and the copper film layer 135 may be formed using copper clad lamination (CCL).

Here, each of the first insulation layer 120 and the copper film layer 135 may have an opening for exposing the metal projection 115.

A physical processing may be performed to form the opening. For example, a drilling processing or laser processing may be performed to form the opening.

A thermo compression process may be performed so that the first insulation layer 120 and the copper film layer 135 are disposed on the metal plate 110 while the openings are aligned to expose the metal projection 115 to integrate the metal projection the first insulation layer 120 and the copper film layer 135.

Figure 10:
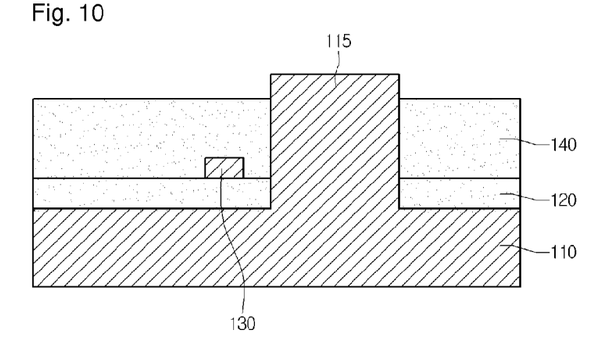

As shown in FIG. 10, the copper film layer 135 is etched to form a first circuit pattern 130 having a predetermined shape. As shown in FIGS. 2 and 3, the first circuit pattern 130 may extend to cross the metal plate 110 in a line direction along the metal projection 115 on a side surface of the metal projection 115.

The first circuit pattern 130 is buried to form a second insulation layer 140.

The second insulation layer 140 may be formed by coating a prepreg in which a resin such as an epoxy-based resin into a reinforced fiber, a glass fiber, or a filler on the first insulation layer 120. The second insulation layer 140 has an opening which is aligned with the opening of the first insulation layer 120 to expose the metal projection 115.

Figure 11:
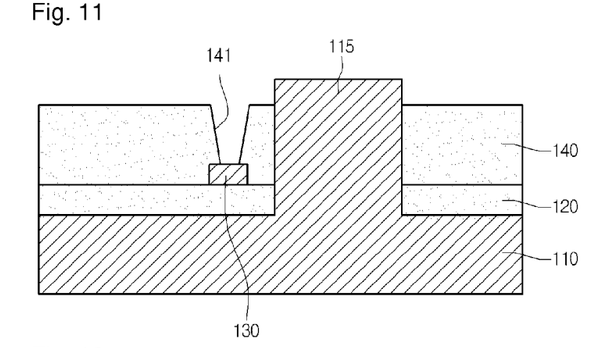

As shown in FIG. 11, a via hole 141 for exposing the lower first circuit pattern 130 is formed on the second insulation layer 140.

The via hole 141 may have a side surface inclined at a predetermined angle with respect to a plane of the metal plate 110. On the other hand, the via hole 141 may have a side surface perpendicular to the plane of the metal plate 110.

The via hole 141 may be formed using a laser. Here, a UV laser or a $CO_2$ layer may be uses as the laser.

Also, the via hole 141 may be formed using a physical process, i.e., a drilling process. Alternatively, the second insulation layer 140 may be etched using a chemical process, i.e., selectively etched to form the via hole 141.

Figure 12:
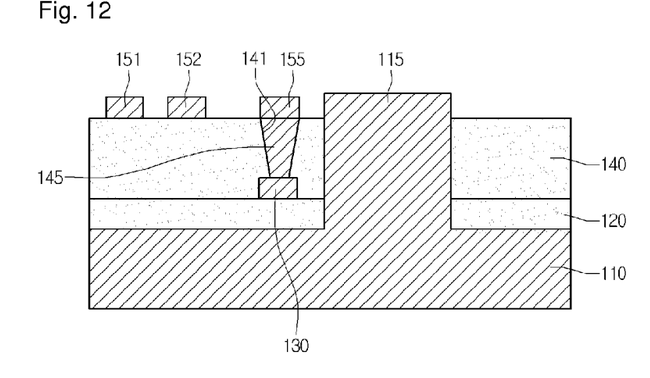

As shown in FIG. 12, the via hole 141 may be filled to form a via 145 and second circuit patterns 153, 155, 151, 152, 154, 156a, 156b, 156c, and 156d.

A general circuit patterning process may be used as the process for forming the via 145 and the process for forming the second circuit pattern 153, 155, 151, 152, 154, 156a, 156b, 156c, and 156d.

For example, a plating process may be performed to fill the via hole 141, thereby forming the via 145. Then, a copper film layer may be formed on the second insulation layer 140. The copper film layer may be patterned to form the second circuit patterns 153, 155, 151, 152, 154, 156a, 156b, 156c, and 156d.

Alternatively, a conductive paste may be coated within the via hole 141 to fill the via hole 141. Then, the copper film layer may be stacked on the filled via hole 141 and patterned to form the second circuit patterns 153, 155, 151, 152, 154, 156a, 156b, 156c, and 156d.

Alternatively, unlike FIG. 11, the copper film layer may be continuously stacked on the second insulation layer 140, and then the via hole 141 passing the copper film layer and the second insulation layer 140 to expose the first circuit pattern 130 may be formed. Thereafter, a plating process may be performed to form a metal layer having conductivity on a side surface of the via hole 141. Then, the copper film layer may be patterned to form the second circuit patterns 153, 155, 151, 152, 154, 156a, 156b, 156c, and 156d.

Figure 13:
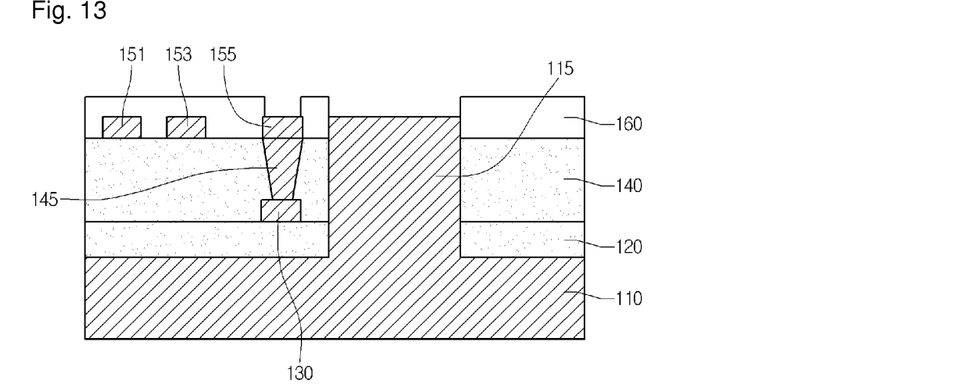

As shown in FIG. 13, the electrode pads 153 and 155 and the power pads 156a, 156b, 156c, and 156d of the second circuit patterns 153, 155, 151, 152, 154, 156a, 156b, 156c, and 156d and the mounting pad 115a are exposed to bury circuit wires 151, 152, and 154, thereby forming a third insulation layer 160.

A solder resist may be coated and cured to form the third insulation layer 160.

Here, a surface processing may be performed on the electrode pads 153 and 155, the power pads 156a, 156b, 156c, and 156d, and the mounting pad 115a which are exposed by the third insulation layer 160 to improve a bonding property.

Figure 14:
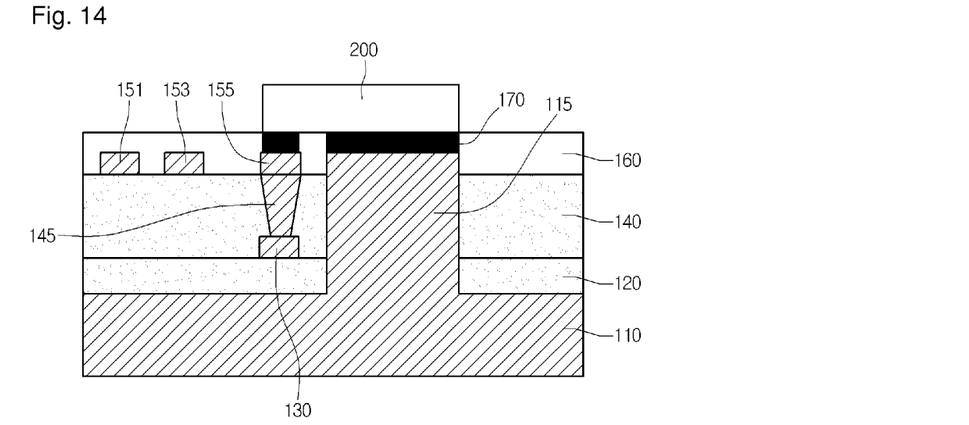

As shown in FIG. 14, a solder cream 170 may be coated on the mounting pad 115a that is a top surface of the exposed metal projection 115 and the electrode pads 153 and 155 and the heat generating device 200 may be mounted to perform thermal processing, thereby completing the heat generating device package.

As described above, the electrode pads 153 and 155 may be formed on a side of the metal projection 115 while the metal projection 115 is integrally formed. Then, the circuit wire for applying a power into the electrode pads 153 and 155 may be stacked into a plurality of layers. Thus, an area of the metal projection 115 may be expanded on a top surface of the radiant heat circuit board 100.

Hereinafter, a backlight unit including the heat generating device package of FIG. 14 will be described with reference to FIG. 15.

Figure 15:
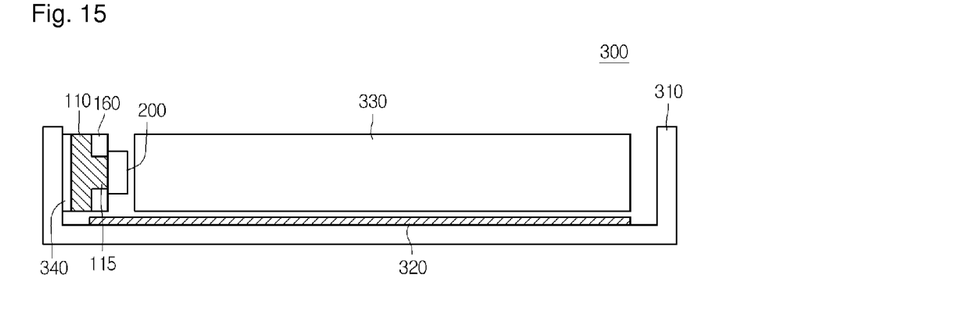
FIG. 15 is a sectional view of a backlight unit including the heat generating device package of FIG. 2.

Referring to FIG. 15, a backlight unit 300 according to an embodiment includes a bottom cover 310, a reflective layer 320 on the bottom cover 310, a light guide plate 330 on the reflective layer 320, and a heat generating device package attached to a side surface of the bottom cover 310.

The heat generating device package may be a light emitting device package including a light emitting device 200. A light emitting diode chip is mounted on the light emitting device package.

As described in FIGS. 2 to 14, the light emitting device package includes the light emitting device 200 to which the radiant heat circuit board is attached. Here, the light emitting device 200 emits light toward a side surface of the light guide plate 330.

The light emitting device package may physically adhere to a side surface of the bottom surface 310 through a radiant heat adhesion layer 340 and be fixed through a bracket.

The reflective layer 320 may extend up to a lower portion of the light guide plate 330 and a lower portion of light emitting device package to reflect light dispersed onto a bottom surface of the light guide plate 330, thereby emitting the light toward a top surface of the light guide plate 330.

The light guide plate 330 may be a surface light source which emits light incident from the side surface toward the top surface. Thus, the light guide plate 330 may uniformly emit light onto a display panel disposed on the top surface thereof.

The radiant heat circuit board may be used in the backlight unit to release heat generated from the light emitting device 200 to the outside through the bottom cover 310.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A radiant heat circuit board for mounting a plurality of heat generating devices, the radiant heat circuit board comprising:
a metal plate comprising an integrated metal projection to which the plurality of heat generating devices are attached;
a first insulation layer exposing the integrated projection and disposed on the metal plate;
a second insulation layer exposing the integrated metal projection and disposed on the first insulation layer;
a first electrode pad on the second insulation layer and disposed on a side of the integrated metal projection;
a second electrode pad on the second insulation layer and disposed on the side of the integrated metal projection in the same direction as that of the first electrode pad, wherein the first and second electrode pads disposed are electrically separated from each other;
a first pattern disposed on the first insulation layer and connected with the first electrode pad; and
a second pattern disposed on the second insulation layer and connected with the second electrode pad,
wherein the first electrode pad receives a voltage from the first circuit pattern, and the second electrode pad receives a voltage from the second circuit pattern.

2. The radiant heat circuit board according to claim 1, wherein the metal projection has a single flat top surface; and
wherein the plurality of heat generating devices are attached on the single flat top surface of the metal projection.

3. The radiant heat circuit board according to claim 1,
wherein the plurality of heat generating devices comprise a first heat generating device disposed on the single flat top surface and a second heat generating device disposed on the single flat top surface; and
wherein the single flat top surface is disposed into an area between the first and second heat generating devices,
wherein the first and second electrode pads connect circuit patterns disposed on the insulation layers different from each other and receive a voltage from the circuit patterns.

4. The radiant heat circuit board according to claim 1, wherein the metal projection comprises:
a mounting pad in which a portion of a top surface thereof is exposed to mount the heat generating device; and
a connection part connecting the mounting pad to the adjacent mounting pad.

5. The radiant heat circuit board according to claim 4, wherein the one mounting pad, the one first electrode pad, and the one second electrode pad separated from the first electrode pad are disposed on one area on which the one heat generating device is mounted.

6. The radiant heat circuit board according to claim 5, wherein the first electrode pad is connected to the second electrode pad disposed on an area on which the adjacent heat generating device is mounted.

7. The radiant heat circuit board according to claim 1, wherein the second insulation layer has a via hole exposing the first circuit pattern, and the first circuit pattern is electrically connected to the first electrode pad through the via hole.

8. The radiant heat circuit board according to claim 1, wherein the radiant heat circuit board exposes the first and second electrode pads on the second insulation layer and further comprises a solder resist for burying the second circuit pattern.

9. A heat generating device package comprising:
a radiant heat circuit board comprising an integrated pad in which a plurality device mounting areas are defined, a metal plate comprising an integrated projection on which the integrated pad is disposed, the integrated pad crossing the plurality of device mounting areas and being connected to an adjacent pad, a plurality of insulation layers exposing the integrated pad and burying a plurality of circuit patterns, and a plurality of electrode pads disposed on the insulation layers and connected to the circuit patterns; and
a plurality of heat generating devices attached to the integrated pad and the electrode pads which are exposed to each of the device mounting areas,
wherein the plurality of insulating layers comprise:
a first insulation layer exposing the integrated metal projection and disposed on the metal plate; and
a second insulation layer exposing the integrated metal projection and disposed on the first insulation layer;
wherein the plurality of electrode pads comprise:
a first electrode pad on the second insulation layer and disposed on a side of the integrated metal projection; and
a second electrode pad on the second insulation layer and disposed on the side of the integrated metal projection in the same direction as that of the first electrode pad, wherein the first and second electrode pads disposed are electrically separated from each other;
wherein the plurality of circuit patterns comprise:
a first pattern disposed on the first insulation layer and connected with the first electrode pad; and
a second pattern disposed on the second insulation layer and connected with the second electrode pad,
wherein the first electrode pad receives a voltage from the first circuit pattern, and the second electrode pad receives a voltage from the second circuit pattern.

10. The heat generating device package according to claim 9, wherein the heat generating device is a light emitting diode.

11. The heat generating device package according to claim 9, wherein the radiant heat circuit board comprises:
a solder resist exposing a top surface of the metal projection on each of the device mounting areas and the electrode pads.

12. The heat generating device package according to claim 9, wherein the first and second electrode pads are connected to the first and second circuit patterns through a via defined within the first and second insulation layers.

13. The heat generating device package according to claim 11, wherein the metal projection has a single flat top surface; and
wherein the plurality of heat generating devices are attached on the single flat top surface of the metal projection.

14. The heat generating device package according to claim 13, wherein the plurality of heat generating devices comprise a first heat generating device disposed on the single flat top surface and a second heat generating device disposed on the single flat top surface; and wherein the single flat top surface is disposed into an area between the first and second heat generating devices.

15. A method of manufacturing a radiant heat circuit board for mounting a plurality of heat generating devices, the method comprising:

forming an integrated metal projection for attaching the plurality of heat generating devices on a metal plate;

forming a first insulation layer exposing the metal projection on the metal plate;

forming a first circuit pattern on the first insulation layer;

forming a second insulation layer exposing the metal projection on the first insulation layer;

forming a second circuit pattern on the second insulation layer;

forming a first via hole exposing the first circuit pattern in the first and second insulation layers;

forming a second via hole exposing the second circuit pattern in the second insulation layer;

forming a first electrode pad connected to the first circuit pattern by the first via hole on the second insulation layer; and forming a second electrode pad connected to the second circuit pattern by the second via hole on the second insulation layer;

wherein the first electrode pad is disposed on a side of the integrated metal projection and the second electrode pad is disposed on the side of the integrated metal projection in the same direction as that of the first electrode pad, and wherein the first electrode pad receives a voltage from the first circuit pattern, and the second electrode pad receives a voltage from the second circuit pattern.

16. The method according to claim 15, wherein the metal projection has a single flat top surface; and wherein the plurality of heat generating devices are attached on the single flat top surface of the metal projection.

17. The method according to claim 15, wherein the plurality of heat generating devices comprise a first heat generating device disposed on the single flat top surface and a second heat generating device disposed on the single flat top surface; and wherein the single flat top surface is disposed into an area between the first and second heat generating devices.

\* \* \* \* \*